United States Patent [19]

Ghiraldi

[11] Patent Number: 4,921,043

[45] Date of Patent: May 1, 1990

[54] SHELTER DEVICE FOR THE PRODUCTION AND THERMAL CONDITIONING OF APPARATUS, IN PARTICULAR ELECTRONIC APPARATUS GENERATING HEAT

[76] Inventor: Alberto Ghiraldi, Via Palatino 8, Milan 20148, Italy

[21] Appl. No.: 184,604

[22] Filed: Apr. 21, 1988

[30] Foreign Application Priority Data

Apr. 21, 1987 [IT] Italy .............................. 20191 A/87

[51] Int. Cl.$^5$ ...................... F28D 15/00; H01L 23/46
[52] U.S. Cl. .................. 165/32; 165/104.11; 165/104.19; 165/104.33; 165/104.34; 165/45; 361/385
[58] Field of Search ...................... 165/104.33, 45, 902, 165/104.11, 104.19, 32, 104.34; 361/385

[56] References Cited

U.S. PATENT DOCUMENTS

| 854,278 | 5/1907 | Darlington ..................... 165/104.33 |
| 2,825,034 | 2/1958 | Birchard ......................... 165/104.11 |
| 3,168,777 | 2/1965 | Ridder et al. .................. 165/104.33 |
| 4,009,417 | 2/1977 | Waldon et al. ....................... 361/38 |
| 4,009,418 | 2/1977 | Bennett .......................... 165/104.33 |
| 4,285,027 | 8/1981 | Mori et al. ..................... 165/104.21 |

FOREIGN PATENT DOCUMENTS

| 37938 | 4/1978 | Japan .............................. 165/104.33 |
| 19636 | 2/1983 | Japan ..................................... 165/45 |
| 351906 | 12/1929 | United Kingdom .................. 165/47 |

Primary Examiner—Albert W. Davis, Jr.
Attorney, Agent, or Firm—Calfee, Halter & Griswold

[57] ABSTRACT

A container device for the protection and thermal conditioning of electronic apparatus generating heat consisting of two heat exchangers each consisting of a plurality of ring form, closed circuits, structurally independent, containing a fluid acting as a thermal carrier.

9 Claims, 4 Drawing Sheets

SHELTER DEVICE FOR THE PRODUCTION AND THERMAL CONDITIONING OF APPARATUS, IN PARTICULAR ELECTRONIC APPARATUS GENERATING HEAT

BACKGROUND

This invention refers to a container device for the protection and thermal conditioning of apparatus, and in particular electronic apparatus generating heat, of a structural type consisting of a closed box in which is defined an ambient adapted to contain one or more electronic apparatus, and also at least one heat exchanger, placed in close proximity to the ceiling of the box structure, with a thermal carrying fluid flowing through it and having at least one part of the heat exchanger in the said ambient.

In the field of installation of electronic apparatus such as units which are a part of telecommunication or radar systems, and remote centers for collection of data, it is well known the necessity to protect this apparatus against atmospheric agents and to maintain the ambient in which it is placed at a temperature as near as possible constant and equal to the value established during the development of the project, and necessary for the correct functioning over long periods of time.

To satisfy this above mentioned necessity, and in particular when the electronic apparatus must be installed in remote and isolated areas or when regular maintenance is not necessary, it is well known that the use of a protective and thermal conditioning device known in the English language as "shelter". This device generally consists of a box shape structure with insulated walls to limit the thermal exchange with the outside, and also includes more or less complex systems for the disposal of excess heat accumulated inside produced not only from the power dissipated by the electronic apparatus whilst functioning, but also by eventual increases in the external ambiental temperature.

In particular the conventional devices use as systems for dispersion of the heat, one or more complex heat exchangers with a flow of thermal carrying fluid, which dissipates the excess heat from the shelter in which the electronic apparatus is located, through suitable panels located outside the device. The aforementioned heat exchangers are preferred to air conditioners and heat pumps as they are more reliable and do not need maintenance, or source of energy, as the circulation is by thermal carrying fluid and natural convection.

However, the conventional devices of the abovementioned type present major inconveniences as the efficiency of the dispersal of the heat is inadequate. In fact, if on one hand the difference in the temperature existing between the internal ambient in which is installed the electronic apparatus, and the external ambient is, at least during the coldest part of the day, sufficient to effect the circulation of the heat fluid by natural convection, the liquid circulation is subject to a loss of force. In particular in the thermal exchange panels and in the eventual manifolds and tanks which are an obstacle for the circulation.

The basic problem for the invention to resolve is to contrive a device for the protection and thermal conditioning of electronic apparatus which presents structural characteristics and a functioning to overcome the inconveniences previously specified.

This problem is resolved by the invention of a container device of the type specified, characterized by the fact that this device has at least one heat exchanger consisting of a plurality of closed conduits in a ring form, structurally independent.

Other characteristics and the advantages of a container conforming to the invention are noted in the following description of the type of construction preferred, with data and names indicative and not limited to the references in the attached drawings.

DETAILED DESCRIPTION

Figure 1:
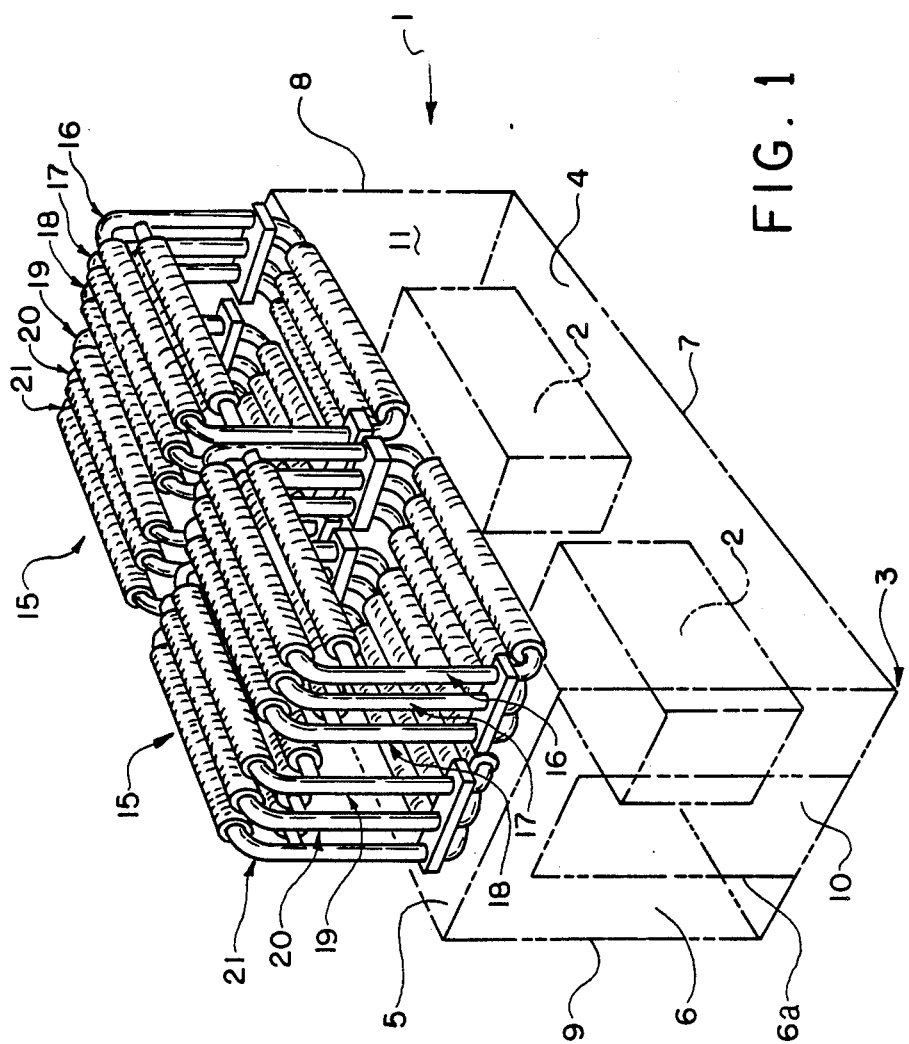
FIG. 1 is a schematic view of a container device conforming to the invention.
Figure 2:
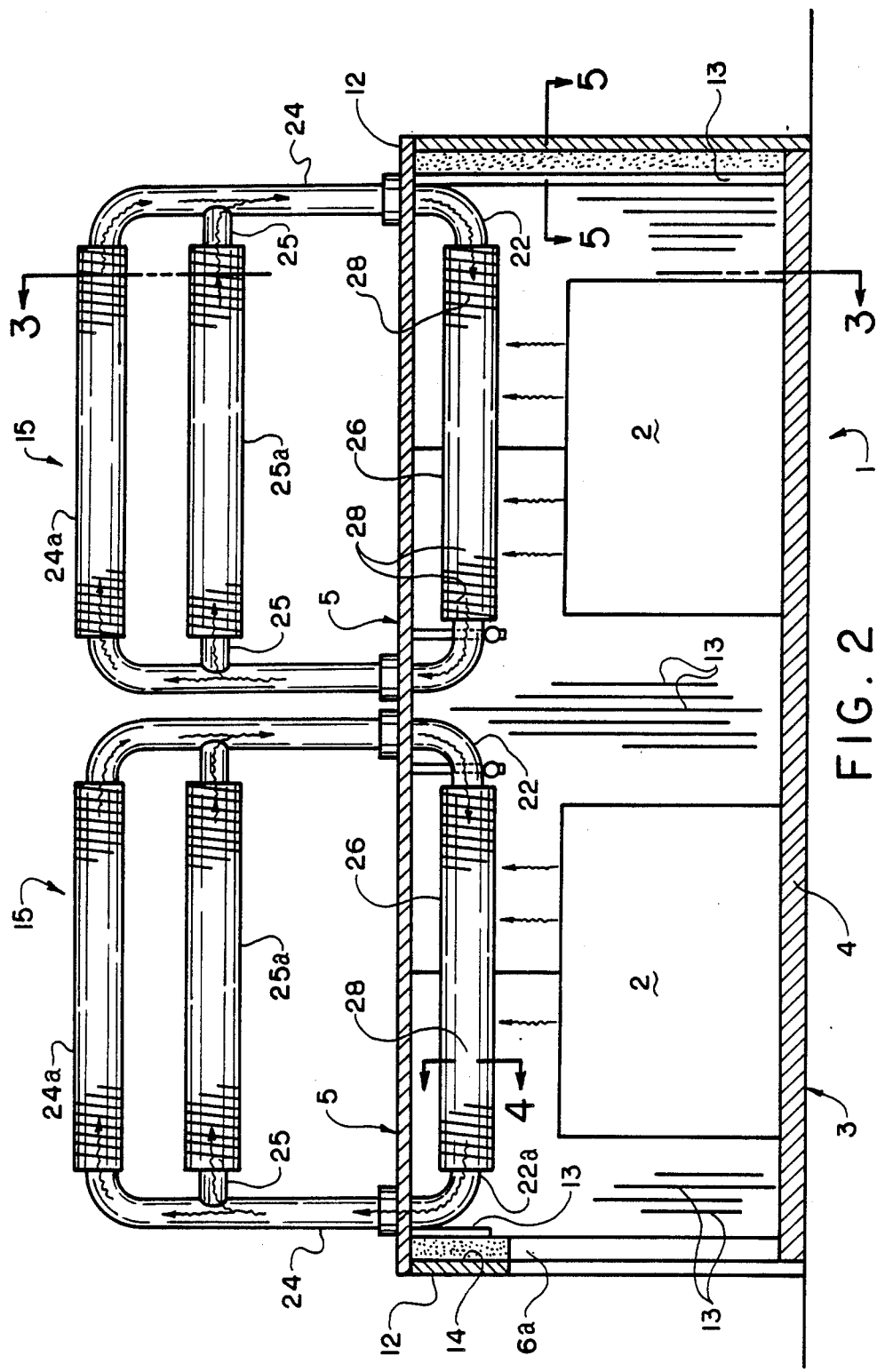
FIG. 2 is a sectioned side view of the device in FIG. 1.
Figure 3:
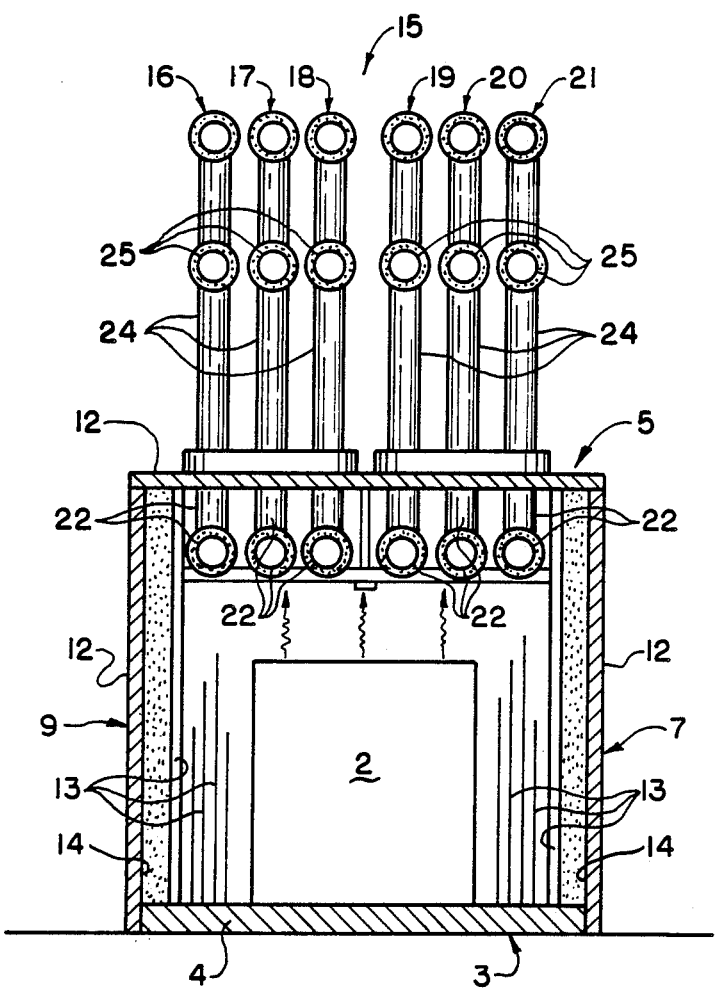
FIG. 3 is a sectioned front view of the device in FIG. 1; in section according to the lines III—III of FIG. 2.
Figure 4:
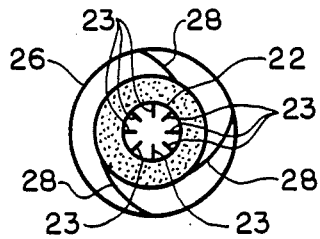
FIG. 4 and 5 are respectively views in a larger scale of details of the device conforming to the invention in section according to the lines IV—IV and V—V of FIG. 2.
Figure 5:
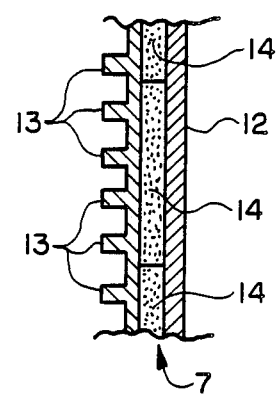

With reference to the abovementioned figures, in FIG. 1 is indicated a container device usually known as a "shelter", for the protection against atmospheric agents, with thermal conditioning of electronic apparatus 2 which is itself conventional; in detail; this electronic apparatus 2, two in the example illustrated, generates heat which prevalently rises while operating.

The container device 1 consists of a closed box shaped structure 3 with a base 4, a counter-positioned ceiling 5 and side walls 6, 7, 8 and 9.

In the lateral wall 6 is an entrance 6a, closed by a door 10.

In the box structure 3 is defined an ambient 11 adapted to hold the electronic apparatus 2.

Advantageously an insulation 12 is fixed externally to each of the lateral walls 6-9 to limit the thermal exchange with the outside. Furthermore, the lateral walls 6-9 may be finned with fins 13 vertically extending into the ambient 11.

The numberal 14 indicates a plurality of cavities formed in each lateral wall 6-9.

The device 1 is a container consisting of two equal heat exchangers, each indicated by 15, in which circulates a thermal carrying fluid flowing by natural convection carrying away the excess heat in the ambient 11 and dispersing it outside the device 1 itself.

The heat exchangers 15 are structurally independent and are both supported in close proximity to the ceiling 5 of the box shaped structure 3.

Each heat exchanger 15 consists of a plurality of conduits positioned according to six closed circuits 16, 17, 18, 19, 20 and 21. They are parallel, structurally independent and in an orderly array.

In detail each closed circuit 19-21 consists of an internal conduit 22 extending into the ambient 11 with a horizontal length 22a internally holding longitudinal fins 23, and an external conduit 24 supported at the outside of the box shaped structure 3 and connected to the internal conduit 22 through the openings formed in the ceiling 5, and an intermediate conduit 25, which is also external to the box structure, connected in parallel to the external conduit 24.

Furthermore, respective horizontal lengths 24a and 25a of the external conduits 24 and intermediate conduits 25 are externally finned.

The container device 1 also consists of a plurality of housings 26 placed over respective horizontal lengths 22a of internal conduits 22 and closed around them so that between each housing 26 and corresponding length 22a of conduit there is defined an annular area 27. Advantageously the housings 26 are externally furnished with helical fins 28 to increase the thermal exchange surface with the ambient 11. In the areas 27 is contained a predetermined quantity of material M susceptible to a change of state at a temperature T lower than a temperature TA predetermined for this ambient 11 for the correct functioning of the electronic apparatus 2.

Advantageously, the cavities 14 in the lateral walls 6–9 are filled with the said material M.

According to a preferred form of realizing the invention versus a temperature TA of around 35° C. this material M is a mixture of normal paraffin C-18 which melts at a temperature T of about 27° C.

The horizontal lengths 22a which constitute the prevailing part of the internal conduits 22, therefore are immersed in the said material M. During operation, material M acts as a heat buffer. During periods of increasing ambient temperature, material M absorbs heat and increases in temperature until it reaches its melting point. Then, material M continues to absorb heat while maintaining itself at a substantially constant temperature by changing its state from solid to liquid. Over time, this process is reversed and repeated.

It is important to note that to avoid excessive increases in temperature, it is necessary to stop the completion of the change of state of all of the quantity of the material M. For this reason the quantity of material M is predetermined in a way so that the change of state is not completed, even during the hottest part of the day when the external temperature of the device is higher than the temperature T and therefore the thermal carrying fluid does not remove the heat to the outside. During the night hours, the external temperature of the device 1 falls below temperature T. As soon as this is achieved, the circulation of the thermal carrying fluid by natural convection in the heat exchanger 15 takes place and it is then possible to remove the excess heat accumulated in the quantity of material M.

A particular feature employed for the purpose of maintaining constant the temperature of the ambient in which is located the electronic apparatus, is, for the same motives previously indicated, the use of this material M in the cavities formed in the lateral walls of the box shaped structure.

Furthermore, in the case of electronic apparatus of high power additional finned containers can be provided, not illustrated, and located close to lateral walls 6–9, and in which there are ulterior quantities of the above mentioned material M.

Advantageously, a mixture of normal paraffin has been chosen as material M having a performance in terms of temperature change from a solid state to a liquid state that is particularly suitable to maintaining the internal ambient of the container device at substantially constant temperature and in practice independent from the variations of the external temperature, as is necessary for the correct functioning of the electronic apparatus.

The container device as per the invention has the principle advantage of being a unit with structural simplicity and with a high efficiency in the removal of excess heat. In particular, the present container device uses heat exchangers with independent anullar circuits in which the thermal carrying fluid circulates by natural convention. The foresight of using heat exchangers with independent circuits is extremely advantageous for reliability reasons.

Furthermore the above described container device does not require regular maintenance and therefore a reliable functioning over a long period of time can be expected.

A further advantage of the invented device is that it offers an ample range of use not only for the type of apparatus to be contained, but also regarding the external climatic conditions. In fact this device can be used under most diverse circumstances by varying the quantity or the type of mixture of paraffin contained in the cavities in the lateral walls and in the areas between the housings and the horizontal lengths of the internal conduits, choosing an adequate thermal carrying fluid and dimensioning in an appropriate mode the conduits and their fins.

Figure 6:
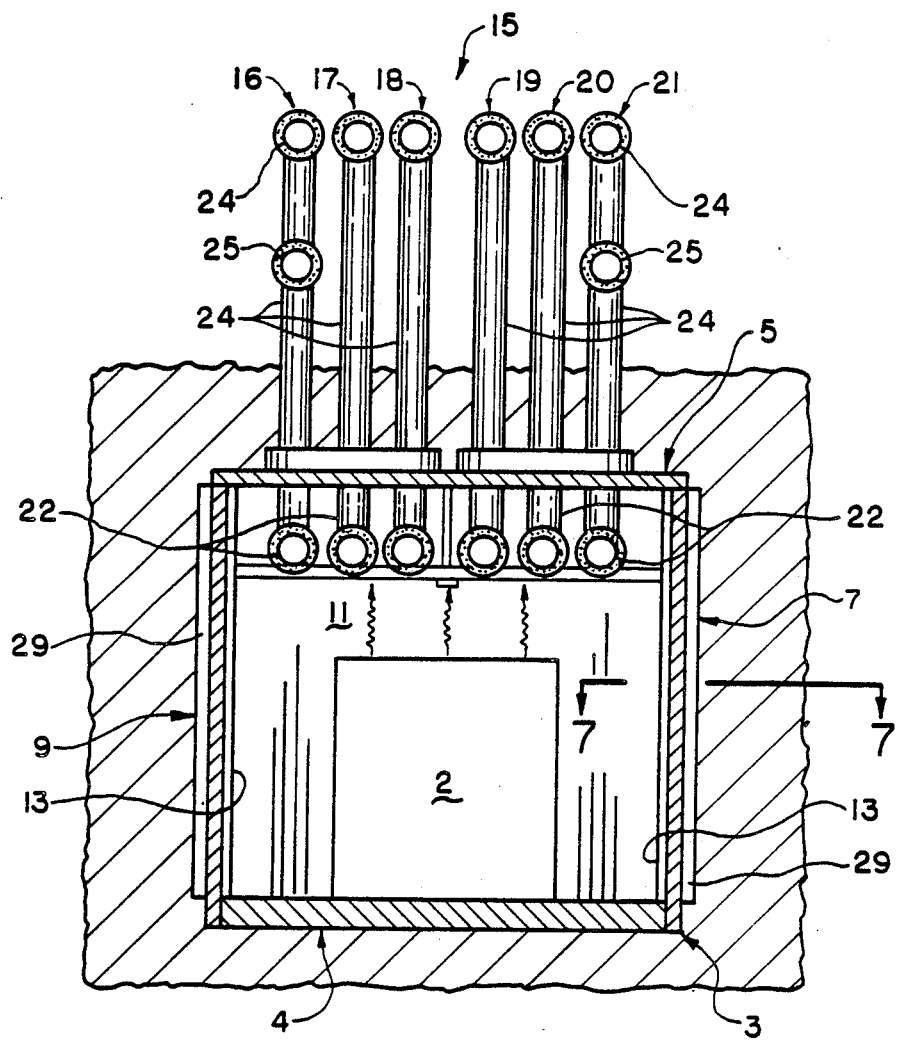
FIG. 6 is a frontal view, in section, of a second example of container device conforming to the invention.
Figure 7:
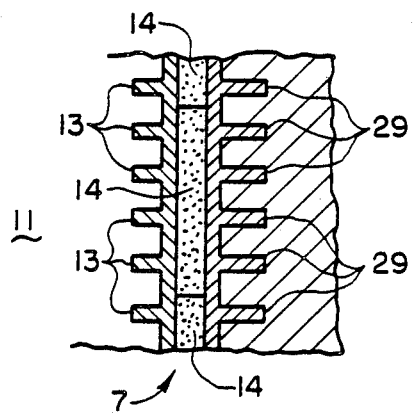
FIG. 7 is an enlarged scale view of a detail of the device in FIG. 6 in section along the lines VII—VII.

In the case that further protection of the electronic apparatus is required for example, for security reasons, advantageously, an alternate container device as per the invention and illustrated in FIG. 6 and 7 may be used. In this device 1, the components which are structurally or functionally equivalent to those already described with reference to the container device illustrated in FIGS. 1 to 5 are indicated with the same reference numbers and will not be described once again.

The closed structured box 3 will advantageously be placed completely underground, and the lateral walls 6–9, which will be in contact with the ground are without insulation and have externally a plurality of vertical fins 29 extended over the entire surface of the lateral walls to increase the surface of thermal exchange with the ground.

Optionally, as shown by container device 1, depicted in FIG. 6 only the closed circuits 16 and 21, external in respect to the closed circuits 17, 18, 19 and 20, may include an intermediate and respective conduit 25.

I claim:

1. A device for the protection and thermal conditioning of heat generating apparatus such as electronic apparatus, comprising a closed box form structure in which is defined an ambient adapted to contain one or more electronic apparatus and at least one heat exchanger placed in close proximity to the ceiling of the box form structure consisting of a plurality of closed circuits containing a thermal carrying fluid which moves solely as a result of natural convection, said circuits having a length within said ambient and a portion outside of said ambient, said length within said ambient being emersed in a predetermined quantity of a mixture of paraffins susceptible to a change in state at a temperature lower than a temperature predetermined for said ambient, said portion of at least one of said circuits outside of said ambient consisting of two parallel conduits, said material being enclosed in the annular space between said length of said circuit within said ambient and a surrounding housing having a diameter larger than said length of said circuit within said ambient, and said length of said circuit within said ambient being furnished internally with longitudinal fins.

2. Container device as per claim 1, wherein the said housing is externally furnished with helical fins.

3. A device for the protection and thermal conditioning of heat generating apparatus such as electronic apparatus, comprising a closed box form structure in which is defined an ambient adapted to contain one or more electronic apparatus and at least one heat exchanger placed in close proximity to the ceiling of the box form structure consisting of a plurality of closed circuits containing a thermal carrying fluid which moves solely as a result of natural convection, said circuits having a length within said ambient and a portion outside of said ambient, said length within said ambient being emersed in a predetermined quantity of a mixture of paraffins susceptible to a change in state at a temperature lower than a temperature predetermined for said ambient, said portion of at least one of said circuits outside of said ambient consisting of two parallel conduits, and a plurality of cavities formed within the lateral walls of the said box-shaped structure, said cavities containing a predetermined quantity of a material susceptible to a change in state at a temperature lower than a temperature predetermined for said ambient.

4. A device as per claim 3, characterized by the fact that the said lateral walls are furnished with fins extended in the said ambient.

5. Container device as per claim 4 characterized by the fact that the said lateral walls are furnished externally with fins extending to the outside of the box-shaped structure.

6. Container device for the protection and thermal conditioning of apparatus, in particular electronic apparatus that generates heat, comprising a closed box for structure in which is defined an ambient adapted to contain one more electronic apparatus and heat exchange means placed in close proximity to the ceiling of the box shaped structure, said heat exchange means including a plurality of independent closed circuits, each of said closed circuits containing a thermal carrying fluid, said fluid in each of the closed circuits being adapted to change density and to circulate in its respective circuit by natural convection in response to heat generated within said ambient, each of said independent closed circuits having a length within said ambient and a portion outside of said ambient, said portion of at least one of said circuits disposed outside of the ambient consisting of two parallel conduits, one of said parallel conduits being vertically aligned with the other of said parallel conduits.

7. Container device as per claim 6, characterized by the fact that the aforementioned length within said ambient is immerged in a predetermined quantity of material susceptible to a change in state at a temperature lower than a temperature predetermined for said ambient.

8. Container device as set forth in claim 6 wherein said portion of said at least one of said circuits disposed outside of the ambient defining a longer fluid path outside of the ambient than the length of said at least one of said circuits disposed inside of the ambient.

9. A device for the protection and thermal conditioning of heat generating apparatus such as electronic apparatus, comprising a closed box form structure in which is defined an ambient adapted to contain one or more electronic apparatus and at least one heat exchanger placed in close proximity to the ceiling of the box form structure consisting of a plurality of closed circuits containing a thermal carrying fluid which moves solely as a result of natural convection, each of said circuits having a length within said ambient and a portion outside of said ambient, said length within said ambient being emersed in a predetermined quantity of a mixture of paraffins susceptible to a change in state at a temperature lower than a temperature predetermined for said ambient, said portion of at least one of said circuits outside of said ambient consisting of two parallel conduits, said length within said ambient being furnished internally with longitudinal fins.

* * * * *

UNITED STATES PATENT AND TRADEMARK OFFICE
CERTIFICATE OF CORRECTION

PATENT NO. : 4,921,043
DATED : May 1, 1990
INVENTOR(S) : Alberto Ghiraldi

It is certified that error appears in the above-identified patent and that said Letters Patent is hereby corrected as shown below:

ON TITLE PAGE:

In the Abstract, at line 4, please replace "ring form, closed circuits" with -- annular circuits --.

Signed and Sealed this

Twenty-seventh Day of August, 1991

Attest:

HARRY F. MANBECK, JR.

Attesting Officer

Commissioner of Patents and Trademarks